(12) United States Patent
Strittmatter et al.

(10) Patent No.: US 10,090,274 B2
(45) Date of Patent: Oct. 2, 2018

(54) FLIP CHIP INTERCONNECTION WITH REDUCED CURRENT DENSITY

(71) Applicant: Efficient Power Conversion Corporation, El Segundo, CA (US)

(72) Inventors: Robert Strittmatter, Tujunga, CA (US); Seshadri Kolluri, San Jose, CA (US); Robert Beach, La Crescenta, CA (US); Jianjun Cao, Torrance, CA (US); Alana Nakata, Redondo Beach, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 244 days.

(21) Appl. No.: 14/667,490

(22) Filed: Mar. 24, 2015

(65) Prior Publication Data
US 2015/0270241 A1 Sep. 24, 2015

Related U.S. Application Data

(60) Provisional application No. 61/969,605, filed on Mar. 24, 2014.

(51) Int. Cl.
*H01L 23/00* (2006.01)
*B23K 1/00* (2006.01)
(Continued)

(52) U.S. Cl.
CPC ............ *H01L 24/81* (2013.01); *B23K 1/0004* (2013.01); *B23K 1/0016* (2013.01); *B23K 3/047* (2013.01); *B23K 3/0623* (2013.01); *H01L 23/4824* (2013.01); *H01L 24/83* (2013.01); *B23K 2201/42* (2013.01); *H01L 24/13* (2013.01); *H01L 24/16* (2013.01); *H01L 24/29* (2013.01); *H01L 24/32* (2013.01); *H01L 2224/1312* (2013.01); *H01L 2224/13013* (2013.01); *H01L 2224/13111* (2013.01); *H01L 2224/13116* (2013.01); *H01L 2224/16227* (2013.01); *H01L 2224/2912* (2013.01); *H01L 2224/29012* (2013.01); *H01L 2224/29013* (2013.01); *H01L 2224/29111* (2013.01);
(Continued)

(58) Field of Classification Search
CPC ... H01L 27/14636; H01L 24/81; H01L 24/10; H01L 24/75
See application file for complete search history.

(56) References Cited

U.S. PATENT DOCUMENTS

| | | | |
|---|---|---|---|
| 7,085,143 B1 * | 8/2006 | Dyckman | H01L 23/50 257/724 |
| 2005/0045697 A1 * | 3/2005 | Lacap | B23K 35/0222 228/180.22 |

(Continued)

*Primary Examiner* — Michael Lebentritt
*Assistant Examiner* — Suberr Chi
(74) *Attorney, Agent, or Firm* — Blank Rome LLP

(57) ABSTRACT

A method and system for electrically connect a semiconductor device with a flip-chip form factor to a printed circuit board. An exemplary embodiment of the method comprises: aligning solder contacts on the device with a first copper contact and a second copper contact of the external circuitry, and, applying a supply current only directly to a buried layer of the first copper and not directly to the layer which is nearest the device, such that no current is sourced to the device through the layer nearest the device.

15 Claims, 11 Drawing Sheets

(51) Int. Cl.
*B23K 3/047* (2006.01)
*B23K 3/06* (2006.01)
*H01L 23/482* (2006.01)
*B23K 101/42* (2006.01)

(52) U.S. Cl.
CPC ............... *H01L 2224/29116* (2013.01); *H01L 2224/32227* (2013.01); *H01L 2224/8112* (2013.01); *H01L 2224/81234* (2013.01); *H01L 2224/81447* (2013.01); *H01L 2224/81815* (2013.01); *H01L 2224/8312* (2013.01); *H01L 2224/83447* (2013.01); *H01L 2924/1306* (2013.01); *H01L 2924/1461* (2013.01)

(56) References Cited

U.S. PATENT DOCUMENTS

| | | | | |
|---|---|---|---|---|
| 2009/0057922 | A1* | 3/2009 | Lee | H01L 21/563 257/778 |
| 2012/0155044 | A1* | 6/2012 | Shaddock | H05K 3/328 361/783 |
| 2015/0108644 | A1* | 4/2015 | Kuang | H01L 24/06 257/751 |
| 2015/0270209 | A1* | 9/2015 | Woychik | H01L 21/52 257/774 |

* cited by examiner

US 10,090,274 B2

FLIP CHIP INTERCONNECTION WITH REDUCED CURRENT DENSITY

This application claims the benefit of U.S. Provisional Application No. 61/969,605, filed on Mar. 24, 2014.

BACKGROUND OF THE INVENTION

Flip chip is a method for interconnecting semiconductor devices, such as IC chips and microelectromechanical systems (MEMS), to external circuitry with solder bumps that have been deposited onto the chip pads. The solder bumps are deposited on the chip pads on the top side of the wafer during the final wafer processing step. In order to mount the chip to external circuitry (e.g., a circuit board or another chip or wafer), the chip is flipped over so that its top side faces down, and aligned so that its pads align with matching pads on the external circuit, and then the solder is reflowed to complete the interconnect.

FIG. 1 illustrates a conventional printed circuit board (PCB) routing to a flip-chip mounted device. Copper traces of the PCB (not shown) for source and drain electrodes of a transistor, for example, are attached to the flip chip by aligning device solder with the copper traces to form a plurality of contact points. Current is provided to the device from the drain and device solder adjacent the electrode and current flows out the device from the device solder adjacent the source as would be understood to one skilled in the art.

FIGS. 2A and 2B illustrate a conventional layout for attaching a flip-chip die to a PCB. Current flows into and out of the device through top layer copper fingers 72 on the PCB (not shown). The device solder bumps 74 mate to the copper fingers 72 and facilitate current flowing to and from the device. A primary disadvantage of this design is that current transitions from the copper fingers 72 into solder bump 74 non-uniformly across the copper-solder interface. The non-uniform transfer of current into solder results in regions of high current density beyond the electromigration limit of the solder-copper interface, which, in turn results in reliability limits to the device's performance.

FIGS. 3A, 3B and 3C illustrate another conventional layout for attaching a flip-chip die to a PCB. The design illustrated in FIGS. 3A through 3C is similar to the prior art design discussed above except that multiple layers 72A, 72B of copper fingers 72 are provided to carry current to and from the device solder bump 74. This design also results in current density that is beyond the electromigration limit near the edge of the solder bump 74. As shown in FIG. 3B, a problem area (i.e., high current density) is at the solder-copper interface.

FIGS. 4A and 4B illustrate another conventional layout for attaching a flip-chip die to a PCB that attempts to overcome the current density limitations discussed above. As shown in FIG. 4A, multiple layers 76A, 76B of copper fingers are provided to carry current to and from the device solder contact 74. In this design, the thickness of the second copper layer 76A is increased to approximately 72 μm (2 oz). With this design, peak current density is reduced, but test results demonstrate that there is still an unacceptable current density where the solder contacts the first copper layer 76B.

Accordingly, a flip chip interconnection design and configuration is needed that significantly reduces current density at the solder-copper interface.

SUMMARY OF THE INVENTION

The present invention is directed to methods and systems for connecting a device to external circuitry. The method comprises: aligning solder contacts on the device with a first copper contact and a second copper contact of the external circuitry; and, applying a current only directly to a buried layer of the first copper contact and not directly to a layer nearest the solder contact.

Preferably, the device is a semiconductor device with a flip chip form factor. The external circuitry is a part of a printed circuit board and the buried layer is buried in the printed circuit board.

In preferred embodiments, the first copper contact and the second copper contact are each comprised of multiple copper layers connected by metal filled vias. In some embodiments, the copper contacts may have more than 2 layers.

In another aspect, a system for electrically connecting a device to external circuitry is provided. The system comprises: at least one solder contact electrically connected to the device; at least two copper contacts electrically connected to the external circuitry and made of multiple layers wherein a first layer of the multiple layers is in electrical connection with a rest of the multiple layers and the first electrical contact is between the solder contact and the rest of the multiple layers; and, a current source in direct electrical connection with at least one of the rest of the layers and not in direct electrical connection with the first layer.

In yet another aspect of the present invention, a method of electrically connecting a device to external circuitry is provided. The method comprises: aligning solder contacts on the device with a first copper contact and a second copper contact of the external circuitry; and, applying a current directly to a first layer of the first copper contact and not directly to a second layer of the first copper contact, where the second layer of the first copper contact is closest to the device and the first layer and second layer are electrically connected.

DETAILED DESCRIPTION OF THE INVENTION

In the following detailed description, reference is made to an exemplary embodiment. The exemplary embodiment is described with sufficient detail to enable those skilled in the art to practice it. It is to be understood that other embodiments may be employed and that various structural, logical, and electrical changes may be made.

Figure 5A:
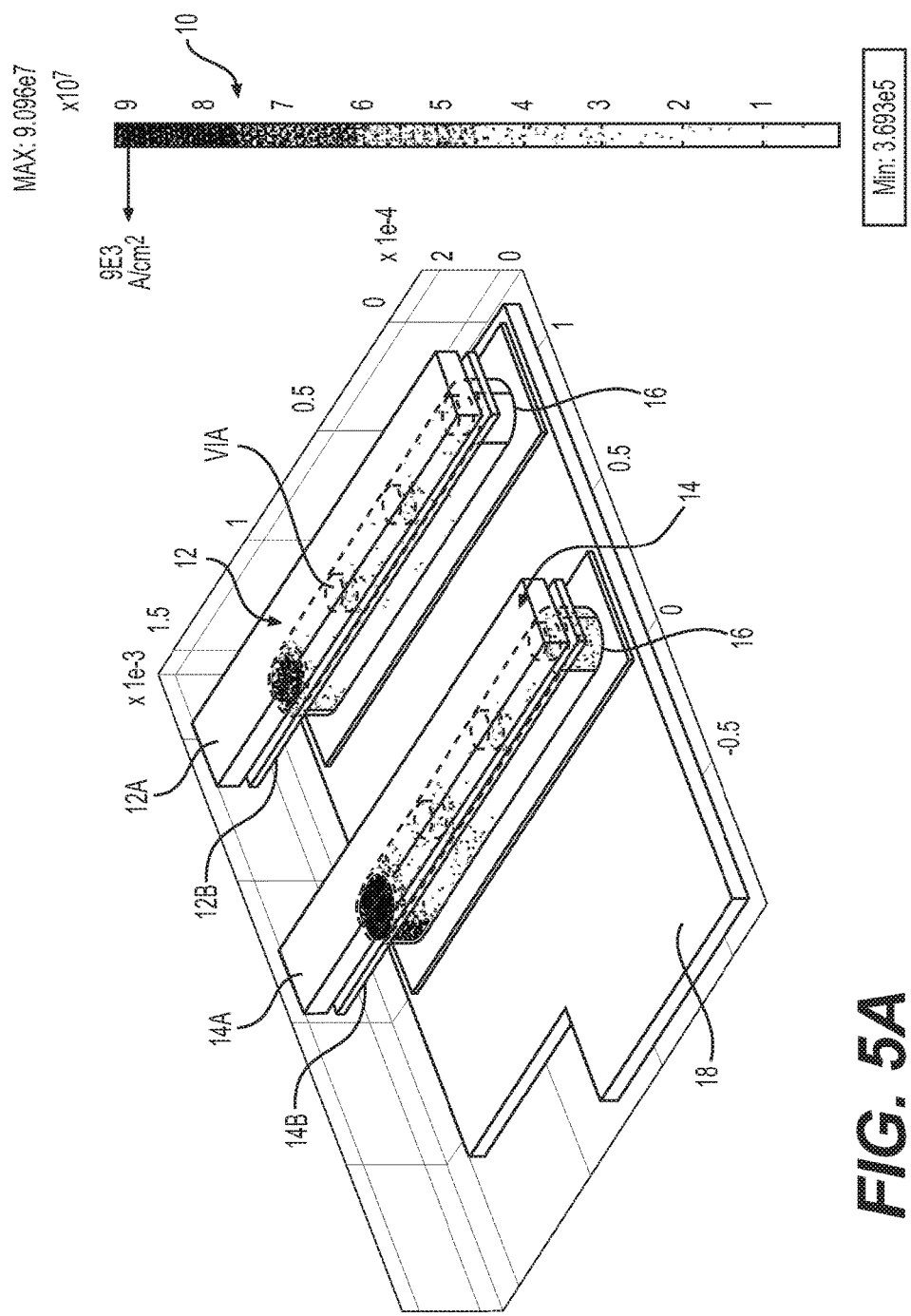
FIG. 5A illustrates a perspective view of a layout for attaching a flip-chip die to a PCB according to an exemplary embodiment of the present patent document.
Figure 5B:
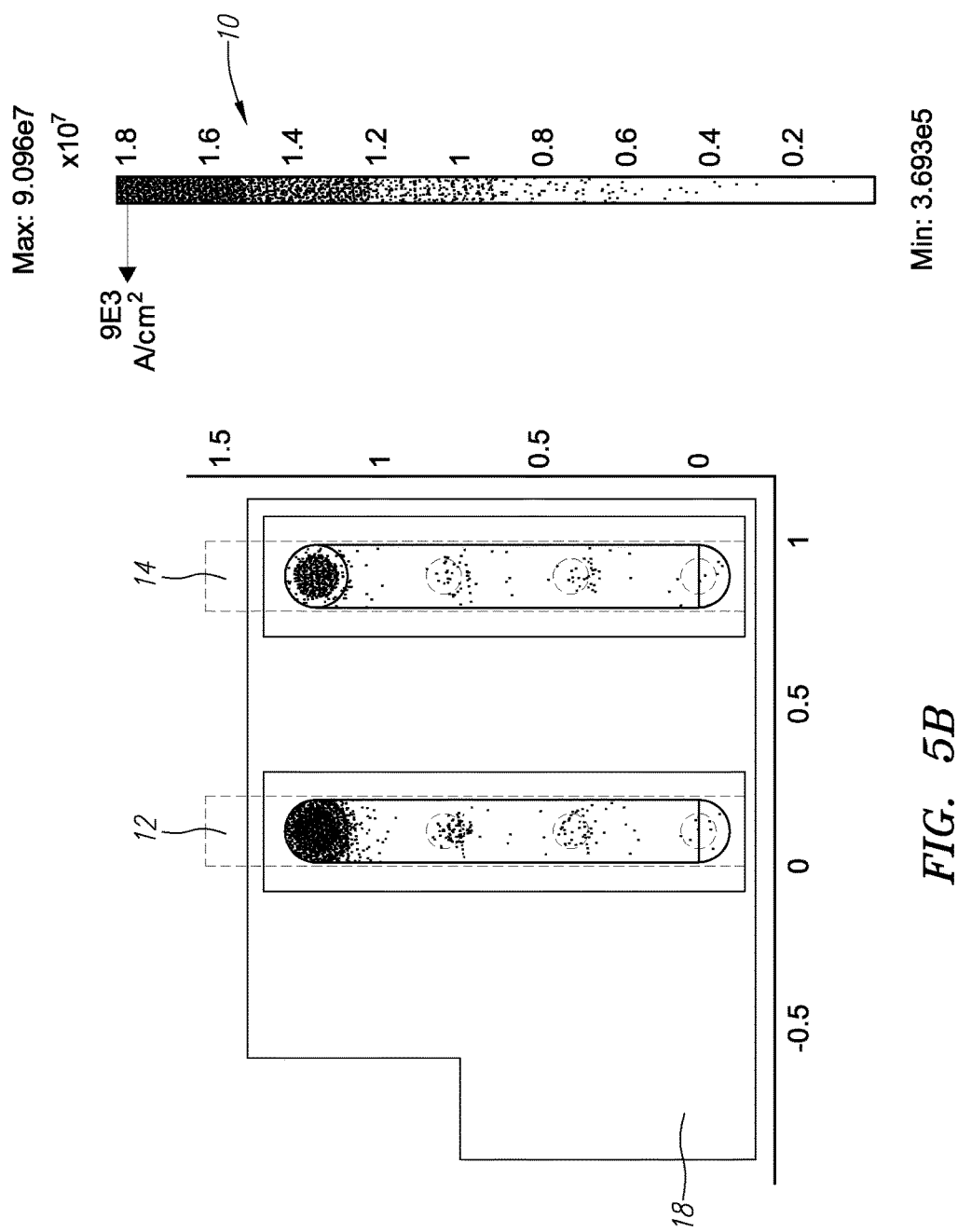
FIG. 5B illustrates a top view of a layout for attaching a flip-chip die to a PCB of FIG. 5A.

FIGS. 5A and 5B illustrate a layout 10 for attaching a flip-chip die (e.g., semiconductor device 18 or the like) to a PCB according to an exemplary embodiment of the present invention. As shown, the layout 10 includes a pair of copper contacts 12 and 14 (i.e., on a substrate, such as a PCB—not shown—or the like) providing current flow to and from the device. In the exemplary embodiment, the copper contacts 12 and 14 correspond to a pair of terminals (e.g., source and drain electrodes) of a field-effect transistor (FET) or the like. Further, a pair of solder contacts 16 (e.g., lead, tin, antimony or the like) on the device 18 are disposed adjacent to and in contact with the copper contacts 12 and 14. It should be appreciated that the solder contacts 16 are deposited onto the chip pads of the device 18. Further, each copper finger includes a plurality of copper layers 12A, 12B, 14A and 14B (e.g., two layers in the illustrated embodiment) stacked on one another.

Figure 1:
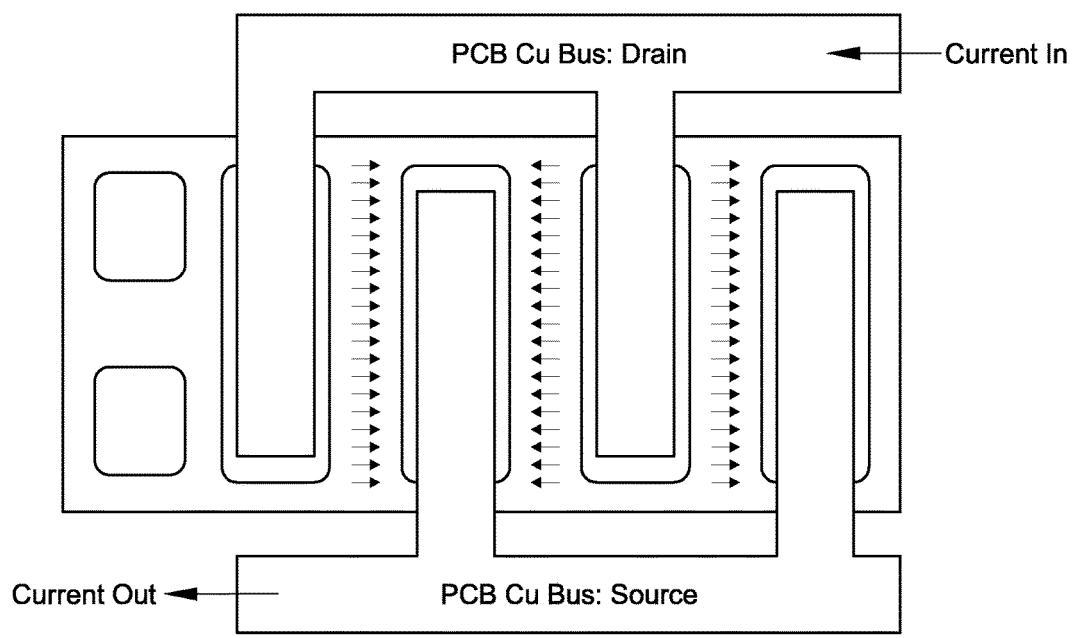
FIG. 1 illustrates a conventional printed circuit board (PCB) routing to a flip-chip mounted device.
Figure 2A:
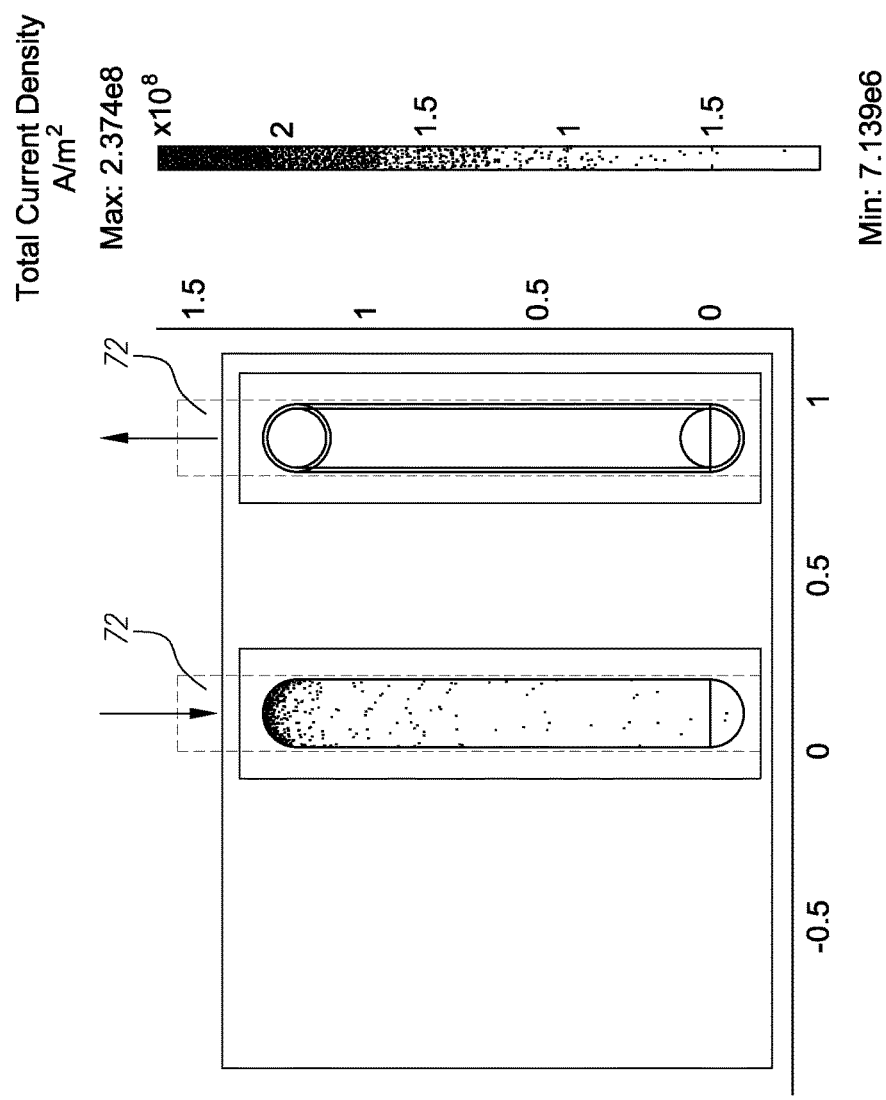
FIG. 2A illustrates a top view of a conventional layout for attaching a flip-chip die to a PCB.
Figure 2B:
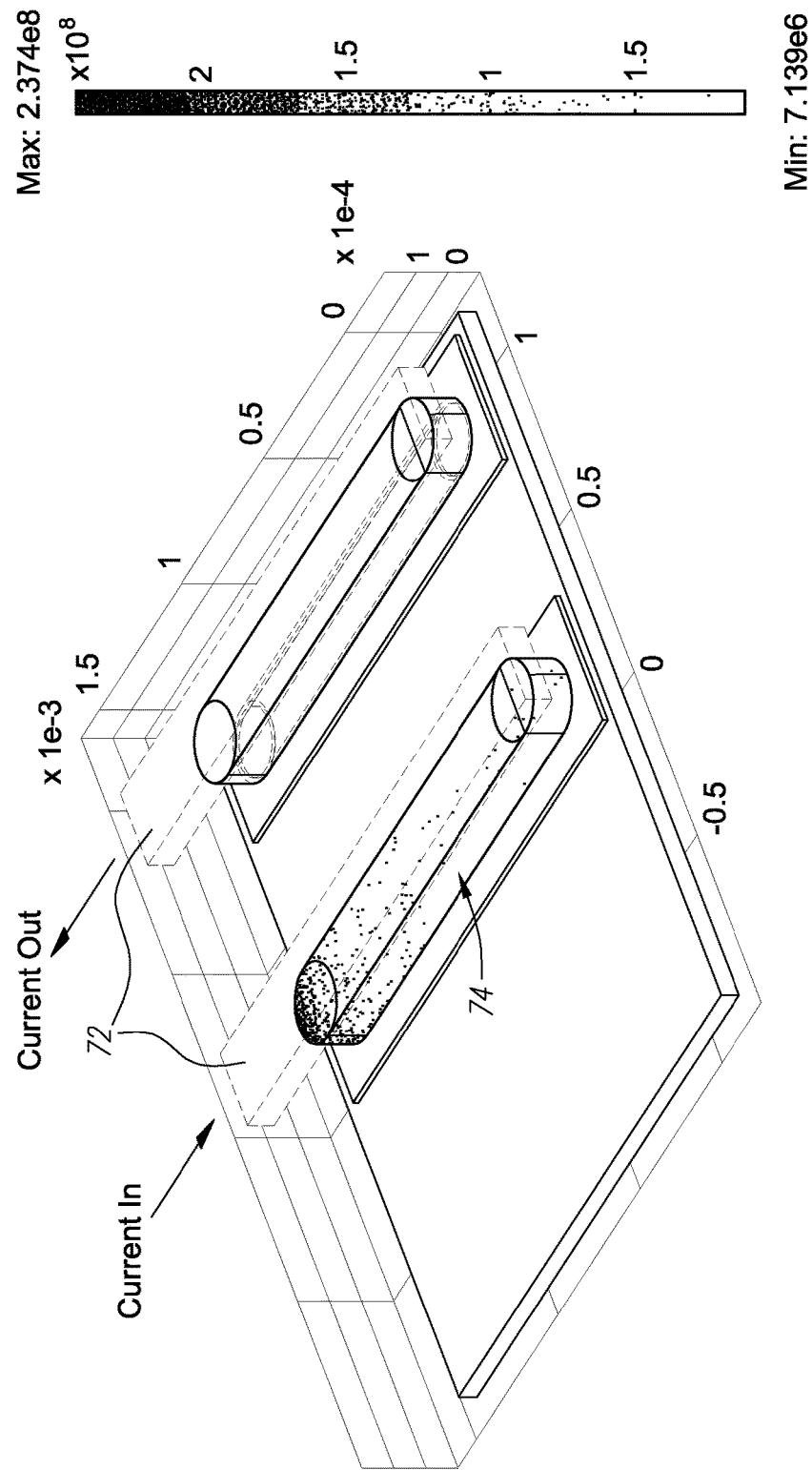
FIG. 2B illustrates a perspective view of the conventional layout for attaching a flip-chip die to a PCB of FIG. 2A.
Figure 3A:
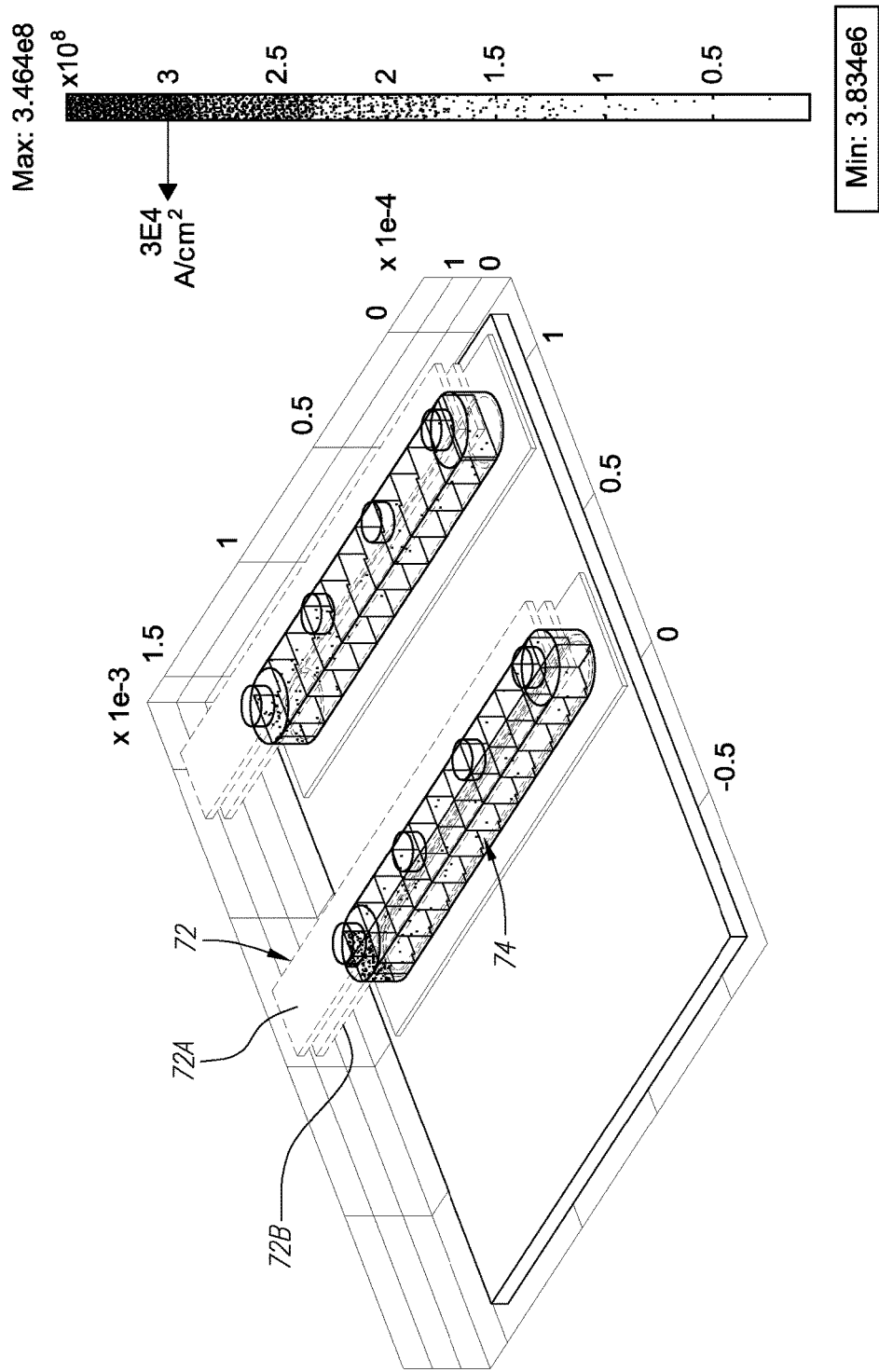
FIG. 3A illustrates a perspective view of another conventional layout for attaching a flip-chip die to a PCB.
Figure 3B:
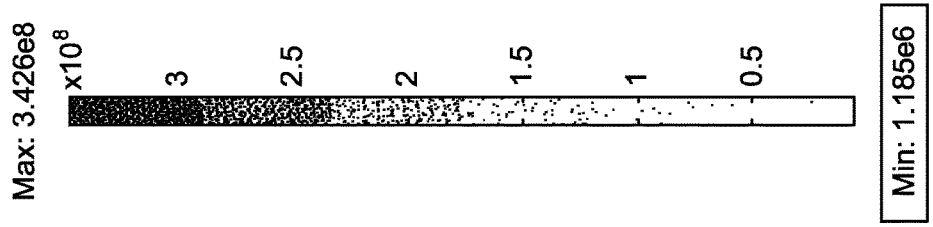
FIG. 3B illustrates a close up view of the problem area of the conventional layout for attaching a flip-chip die to a PCB of FIG. 3A.
Figure 3B:
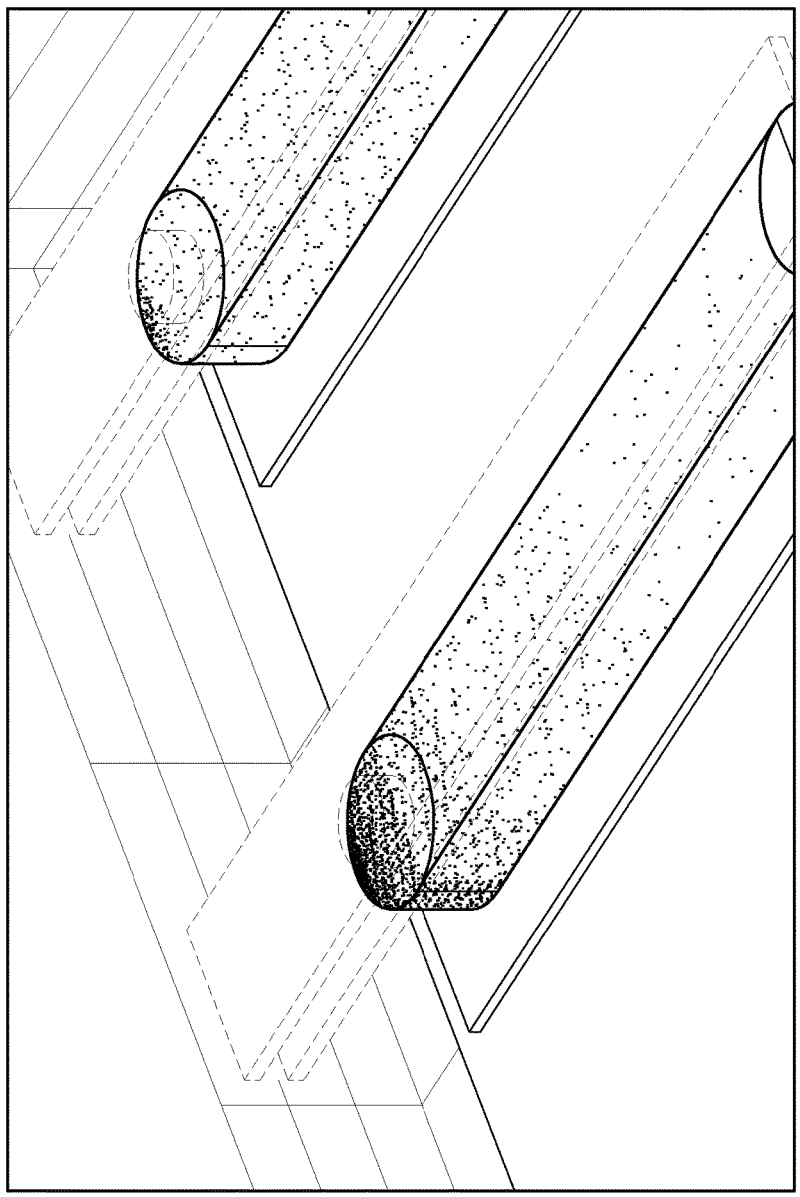
Figure 3C:
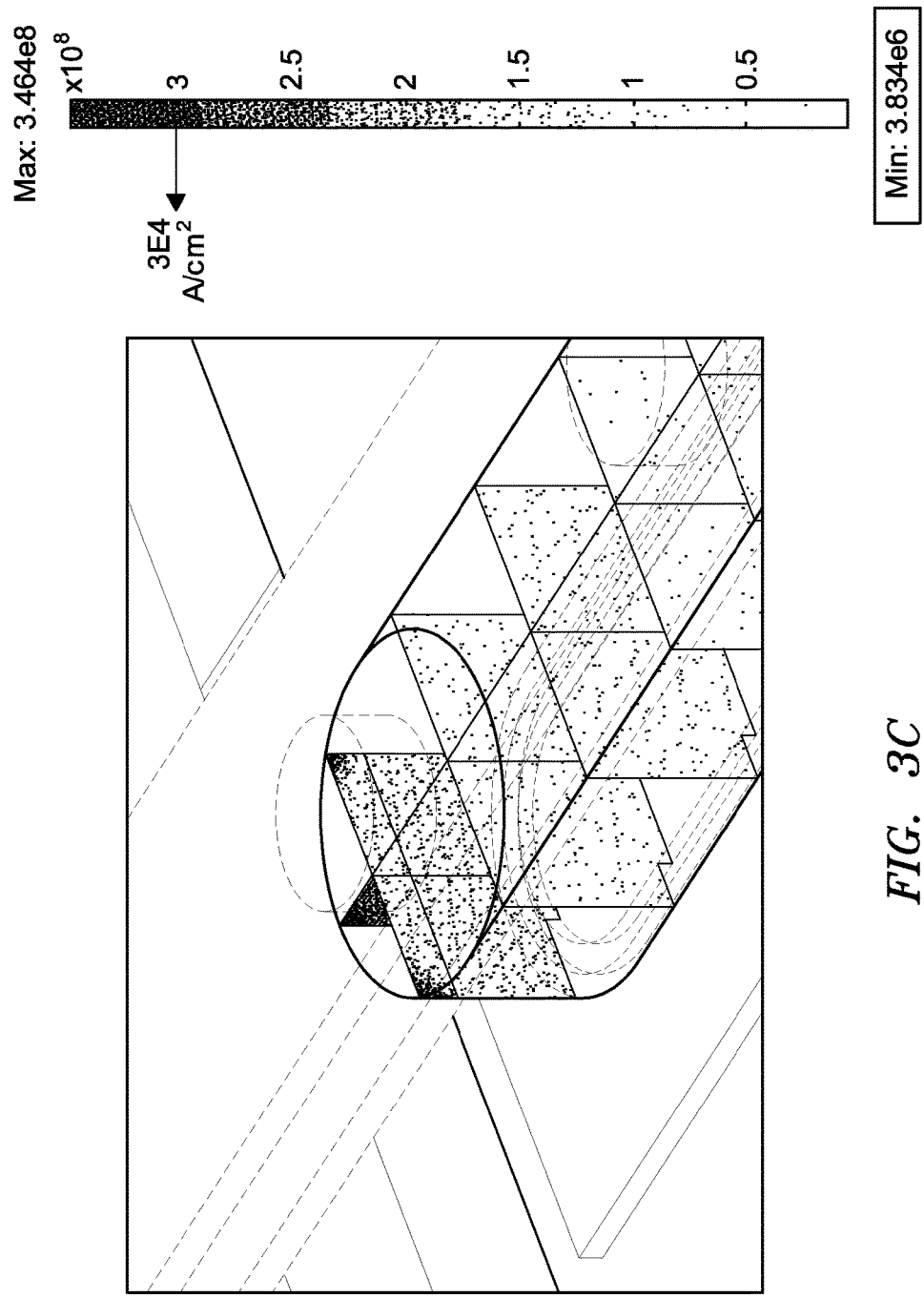
FIG. 3C illustrates a close up view of the problem area of the conventional layout for attaching a flip-chip die to a PCB of FIG. 3B.
Figure 4A:
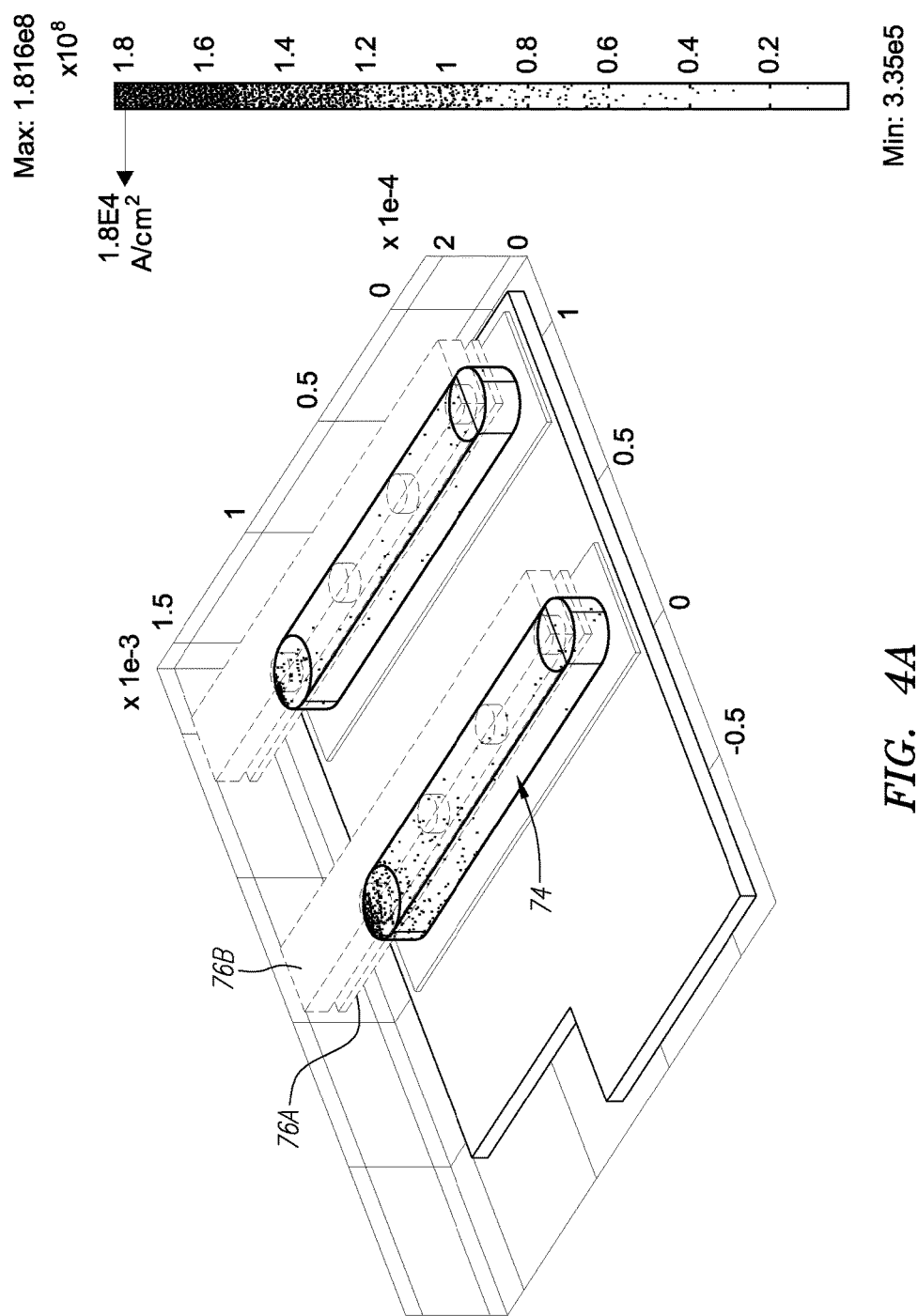
FIG. 4A illustrates a perspective view of yet another conventional layout for attaching a flip-chip die to a PCB.
Figure 4B:
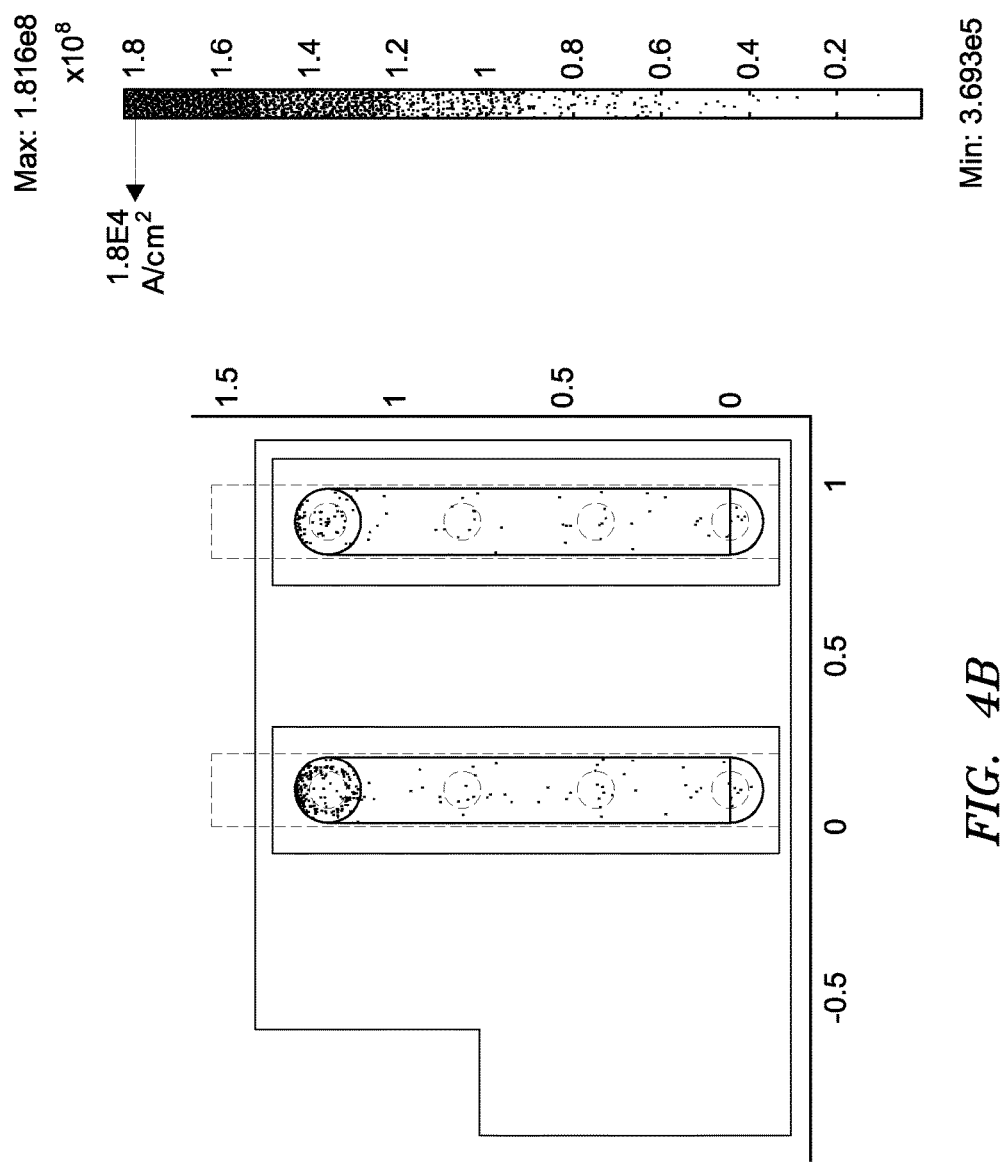
FIG. 4B illustrates a top view of the conventional layout for attaching a flip-chip die to a PCB of FIG. 4A.

The inventive layout illustrated in FIGS. 5A and 5B preferably removes the conductive connection between the top copper layer 12B, 14B (i.e., the copper layer/trace nearest to the device), such that all current flows from deeper layers 12A, 14A of the copper contact 12, 14 to and/or from the device 18. As shown, the inventive design provides for via holes filled with metal that connect different levels of the copper contacts to the device solder. FIG. 5A illustrates that the via holes extend from the device solder 16 through the copper contact 12, 14, providing a configuration where no current is sourced to the device region through the copper layer nearest the device 12B, 14B. Accordingly, current is sourced through the drain electrode to the device 18 through buried levels of copper 12A, 14A in the copper contact 12, 14. As shown in FIG. 5B, current density is highest at the first via, but current density is still reduced by 40% or more compared with the conventional prior art designs discussed above and illustrated in FIGS. 2-4. Thus, the inventive design removes the problem with current crowding where the top copper layer of the copper contact meets the device's solder as experienced by the prior art designs.

Figure 6:
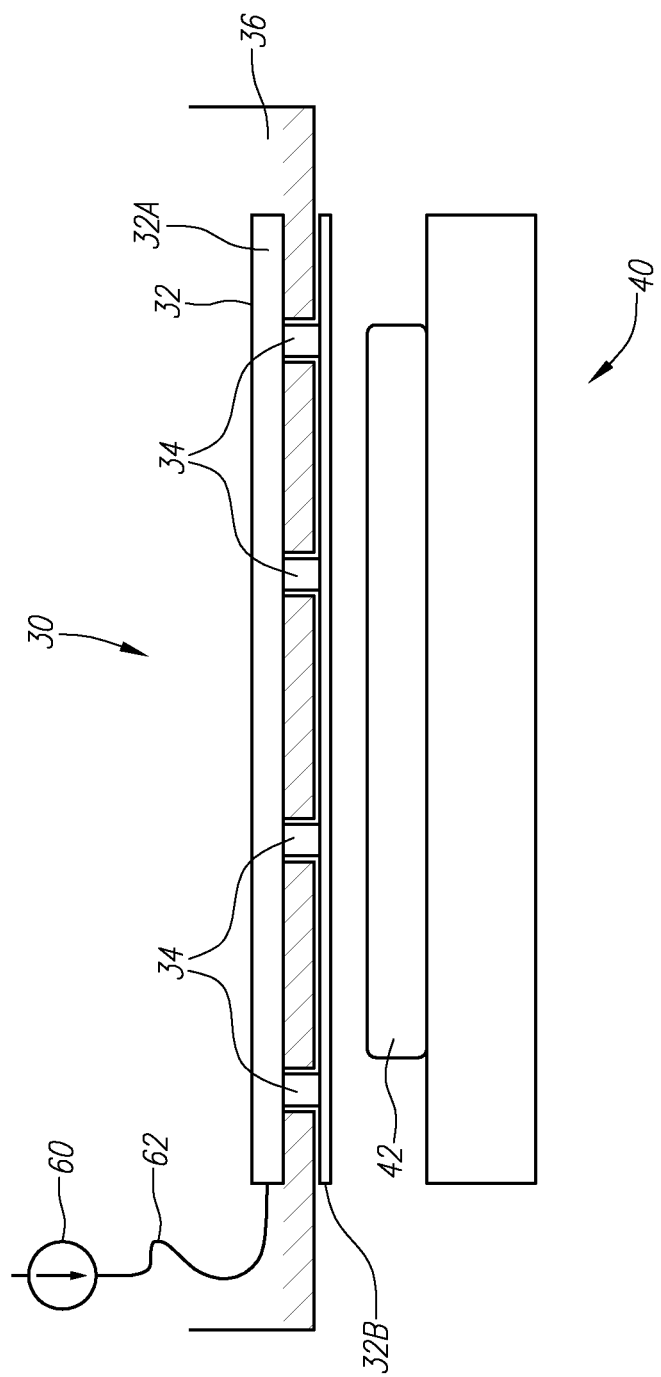
FIG. 6 illustrates a cross section view of a system for attaching a device to external circuitry according to an exemplary embodiment of the present patent document.

FIG. 6 illustrates a cross section view of a system for attaching a device 40 to external circuitry 30 according to an exemplary embodiment of the present patent document. As may be seen in FIG. 6 and explained above, the copper contact 32 has at least two layers 32A and 32B. Layer 32B is closest to the solder contact 42 of the device 40. To this end, layer 32B is between layer 32A and the solder contact 42. As may also be seen in FIG. 6, layer 32B is electrically connected to layer 32A by vias 34. In a preferred embodiment, vias 34 are filled with a metal.

In some embodiments, the layers of the copper contact 32 that are not closest to the solder layer 42 may be buried within a PCB board 36. In other embodiments, multiple layers of the copper contact 32 that are not exposed directly to the solder contact 42 may be buried or otherwise prevented from direct contact with the solder contact 42.

According to the present patent document, a current supply 60 is only connected to layers of the copper contact that are not in direct contact with the solder contact 42. To this end, in the embodiment shown in FIG. 6, the current source 60 is connected directly only to layer 32A via electrical connection 62. Consequently, current flowing to layer 32B must flow through vias 34.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A method of directly electrically connecting a device to circuitry of a printed circuit board (PCB), the method comprising:
    aligning solder contacts on the device with a first copper contact and a second copper contact of the PCB, wherein the first and second copper contacts of the PCB each comprise a plurality of layers, wherein the plurality of layers within each of the first and second copper contacts are electrically connected by metal filled vias; and,
    applying a source current only directly to a layer of the plurality of layers of the first copper contact other than a layer of the plurality of layers of the first copper contact nearest the solder contacts on the device, such that no current is directly sourced to the device through the layer of the first copper contact nearest the solder contacts on the device;
    wherein the layer of the plurality of layers of the first copper contact other than the layer of the first copper contact nearest the solder contacts on the device is embedded in the PCB.

2. The method of claim 1, wherein the device has a flip chip form factor.

3. The method of claim 2, wherein the device is a semiconductor device.

4. The method of claim 1, wherein the plurality of layers are each comprised of copper.

5. The method of claim 1, wherein the first copper contact and second copper contact each have more than two layers.

6. A system for directly electrically connecting a device to circuitry of a printed circuit board (PCB), the system comprising: at least one solder contact of the device; at least one copper contact electrically connected to the PCB and the solder contact of the device, each of the at least one copper contact being formed of multiple layers, wherein a first layer of the multiple layers of each of the at least one copper contact is closest to the solder contact of the device and wherein the first layer of each of the at least one copper contact is electrically connected with other layer or layers of the multiple layers by metal filled vias; and, a current source only directly electrically connected to the other layer or layers of the multiple layers of each of the at least one copper contact and is not directly connected to the first layer of each of the at least one copper contact;
    wherein the other of the multiple layers of each of the at least one copper contact is embedded in the PCB.

7. The system of claim 6, wherein the device has a flip chip form factor.

8. The system of claim 7, wherein the device is a semiconductor device.

9. The system of claim 6, wherein the first layer and the other multiple layers each comprise copper.

10. The system of claim 6, wherein each of the at least one copper contact has more than two layers.

11. A method of directly electrically connecting a device to circuitry of a printed circuit board (PCB), the method comprising:
    aligning solder contacts on the device with a first copper contact and a second copper contact of the PCB, the first and second copper contacts of the PCB each comprising multiple layers; and, applying a source current directly to a layer of the multiple layers of the first copper contact of the PCB which is not closest to the device, wherein a layer of the multiple layers of the first copper contact closest to the device and the layer to which the source current is applied are electrically connected by metal filled vias;

wherein the layer to which the source current is applied is embedded in the PCB.

12. The method of claim 11, wherein the device has a flip chip form factor.

13. The method of claim 12, wherein the device is a semiconductor device.

14. The method of claim 11, wherein the multiple layers each comprise copper.

15. The method of claim 11, wherein the first and second copper contacts each have more than two layers.

* * * * *